United States Patent
Kim (10) Patent No.: US 7,716,544 B2
(45) Date of Patent: May 11, 2010

(54) PATH DATA TRANSMISSION UNIT (75) Inventor: Sung-Il Kim, Anyang-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 622 days.

(21) Appl. No.: 11/507,892

(22) Filed: Aug. 22, 2006

(65) Prior Publication Data

US 2007/0061655 A1 Mar. 15, 2007

(30) Foreign Application Priority Data

Aug. 22, 2005 (KR) .................. 10-2005-0076970

(51) Int. Cl.
*G01R 31/3177* (2006.01)
*G01R 31/40* (2006.01)

(52) U.S. Cl. ...................... 714/726; 714/724
(58) Field of Classification Search .............. None
See application file for complete search history.

(56) References Cited

U.S. PATENT DOCUMENTS

| | | | | |
|---|---|---|---|---|
| 5,544,123 | A * | 8/1996 | Hoshi et al. | 365/230.06 |
| 5,900,739 | A * | 5/1999 | Gaglani | 324/765 |
| 6,075,418 | A * | 6/2000 | Kingsley et al. | 331/57 |
| 6,134,191 | A * | 10/2000 | Alfke | 368/118 |
| 6,427,156 | B1 * | 7/2002 | Chapman et al. | 708/235 |
| 6,573,742 | B2 * | 6/2003 | Sim | 324/763 |
| 6,573,751 | B1 * | 6/2003 | Seki | 326/80 |
| 6,700,408 | B2 * | 3/2004 | Lee | 326/86 |
| 6,781,411 | B2 * | 8/2004 | Steiss et al. | 326/46 |
| 2003/0026139 | A1 * | 2/2003 | Endou et al. | 365/200 |
| 2005/0184758 | A1 * | 8/2005 | Hoberman et al. | 326/83 |

FOREIGN PATENT DOCUMENTS

| | | | |
|---|---|---|---|
| JP | 2000311499 A | * | 11/2000 |
| JP | 2002-139545 | | 5/2002 |
| JP | 2002-311092 | | 10/2002 |
| JP | 2003-255024 | | 9/2003 |
| KR | 2001063539 A | * | 7/2001 |
| KR | 1020010063539 A | | 7/2001 |
| TW | 429504 | | 4/2001 |

* cited by examiner

*Primary Examiner*—Kevin L Ellis
*Assistant Examiner*—Dipakkumar Gandhi
(74) *Attorney, Agent, or Firm*—F. Chau & Associates, LLC (57) ABSTRACT

A path data transmission unit in which, if one of a normal path for handling normal data and a test path for handling test data is selected, the other path is disabled to reduce power consumption; includes an edge detector, a first path data transmission block, and a second path data transmission block. The edge detector detects an edge of a test enable signal that indicates a normal operation mode or a test mode and transmits an edge detection signal. The first path data transmission block transmits a first path data in response to the test enable signal, the edge detection signal, a clock signal, normal data and a second path data. The second path data transmission block transmits the second path data in response to the test enable signal, the clock signal, and test data.

12 Claims, 5 Drawing Sheets

PATH DATA TRANSMISSION UNIT

CROSS-REFERENCE TO RELATED PATENT APPLICATION

This application claims the benefit of Korean Patent Application No. 10-2005-0076970, filed on Aug. 22, 2005, in the Korean Intellectual Property Office, the disclosure of which is incorporated herein in its entirety by reference.

BACKGROUND OF THE INVENTION

1. Technical Field

The present disclosure relates to a path data transmission unit, and more particularly, to a path data transmission unit that transmits normal data and test data in a normal mode and a test mode, respectively, through two separate output terminals wherein one of the two data types concurrently transmitted from the two output terminals has a predetermined voltage level.

2. Discussion of the Related Art

Circuits that are designed to externally monitor data processed internally in function blocks or data transferred between function blocks have an advantage in that checking the operational status of the function blocks and detecting the function blocks having an error can be easily performed later on, without disassembling a wafer or a package.

In most digital systems, a plurality of shift registers connected in series is used to transfer and store data, and output data from a plurality of the shift registers connected in series is transmitted to predetermined function blocks. When the system does not operate normally, the place at which the problem occurs should be detected. For such detection, test data is transmitted to a first shift register of the shift registers connected in series and then shifted. Then the test data is transmitted to the function blocks. The operational status of the function blocks can be checked by testing data subsequently transmitted from the function blocks in response to the transmitted input test data. This detection method is called a scan method.

Figure 1:
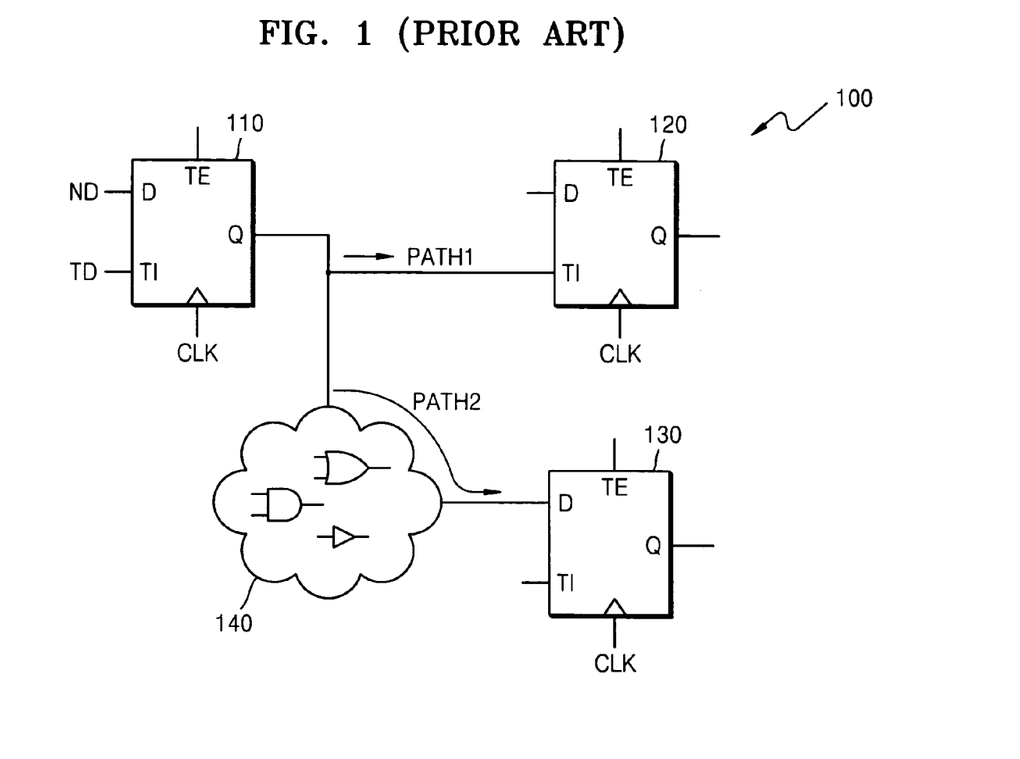
FIG. 1 is a circuit diagram showing a part of a conventional system to which a scan method is applied.

FIG. 1 illustrates a part of a conventional system to which the scan method is applied.

Referring to FIG. 1, the conventional system 100 includes function blocks 140 that perform predetermined functions, and a plurality of shift registers 110,120 and 130.

The first shift register 110 receives normal data ND through a first input terminal D, receives test data TD through a second input terminal TI, stores the test data TD, and transmits the test data TD through an output terminal Q in response to a clock signal CLK. It is determined, based on a test enable signal TE, whether it is a normal mode or a test mode. The first shift register 110 stores and transmits the normal data ND in the normal mode, and stores and transmits the test data TD in the test mode. A second shift register 120 operates in response to an output Q from the first shift register 110. The second shift register 120 operates normally only when the test enable signal TE indicates the test mode, and the other operational characteristics thereof are the same as those of the first shift register 110. A third shift register 130 operates in response to an output signal of a function block 140. The third shift register 130 operates only when the test enable signal TE indicates the normal operation mode, and the other operational characteristics thereof are the same as those of the first shift register 110.

When the test enable signal TE indicates the test mode, the test data TD which is transmitted through the output terminal Q of the first shift register 110 is transmitted to the second input terminal TI of the second shift register 120. When the test enable signal TE indicates the normal mode, the normal data ND which is transmitted through the output terminal Q of the first shift register 110 is transmitted to the function block 140. After being processed by predetermined arithmetic operations, the normal data is transmitted to the third shift register 130.

Hereinafter, the data path formed when the data is transmitted from the output terminal Q of the first shift register 110 to the second input terminal TI of the second shift resister 120 is referred to as a first path Path1, and the data path formed when the data is transmitted from the output terminal Q of the first shift register 110 to the first input terminal D of the third shift resister 130 is referred to as a second path Path2. In addition, the function block to be tested in a test mode is assumed to operate in response to the test data TD transmitted from the output terminal Q of the second shift resister 120, although the connection is not shown in the figure.

It is preferable that, in the test mode, only the first path Path1 is enabled, so that the test data TD is stored in the second shift register 120 and that, in the normal mode, only the second path Path2 is enabled, so that the normal data ND is processed by the function block 140 and stored in the third shift register 130. Referring to FIG. 1, although the third shift resister 130 does not operate in response to the test enable signal TE in the test mode, however, the second path Path2 is activated, so that the function block 140 operates. Therefore, power consumption increases.

Figure 2:
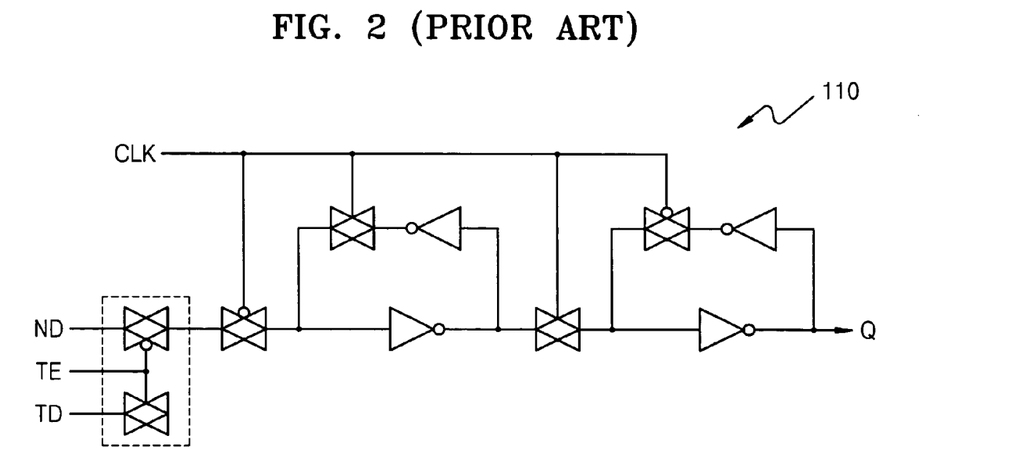
FIG. 2 is an internal circuit diagram of one of the shift registers shown in FIG. 1.

FIG. 2 is an internal circuit diagram of the shift resisters 110,120, and 130 illustrated in FIG. 1

Referring to FIG. 2, the normal data ND or the test data TD is selected according to the test enable signal, and the selection operation is performed inside the dotted rectangle. The shift resisters shown in FIG. 2 are constructed with commonly used master-slave type flip-flops, and a description of the method of operation of the shift registers is omitted.

As illustrated in FIG. 1, even though two separate data paths Path1 and Path2 are not used simultaneously, it is not possible to enable only one path due to the structure using the output of the first shift register 110 as a common input of the second and third shift registers.

SUMMARY OF THE INVENTION

Exemplary embodiments of the present invention provide a path data transmission unit in which, if one of a normal path for handling normal data or a test path for handling test data is selected, the other path is disabled to reduce electric power consumption.

According to an exemplary embodiment of the present invention, there is provided a path data transmission unit that operates in response to a test enable signal and a clock signal, comprising: a first input terminal that receives normal data; a second input terminal that receives test data; a first output terminal that maintains a voltage level of the normal data while the test enable signal indicates a test mode, outputs a first voltage level at the moment when the test enable signal indicates a change from the test mode to a normal operation mode, and then outputs the normal data while the normal operation mode continues and a second output terminal that outputs the test data when the test enable signal indicates the test mode and maintains a voltage level of test data outputted in the test mode.

According to an exemplary embodiment of the present invention, there is provided a path data transmission comprising: an edge detector that transmits an edge detection signal for a test enable signal that indicates a normal mode or a test mode; a first path data transmission block that transmits a first path data in response to the test enable signal, the edge detection signal, a clock signal, normal data, and a second path data; and a second path data transmission block that transmits the second path data in response to the test enable signal, the clock signal, and test data.

BRIEF DESCRIPTION OF THE DRAWINGS

Exemplary embodiments of the present invention can be understood in more detail from the following descriptions taken in conjunction with the attached drawings in which.

DETAILED DESCRIPTION OF EXEMPLARY EMBODIMENTS

Figure 3:
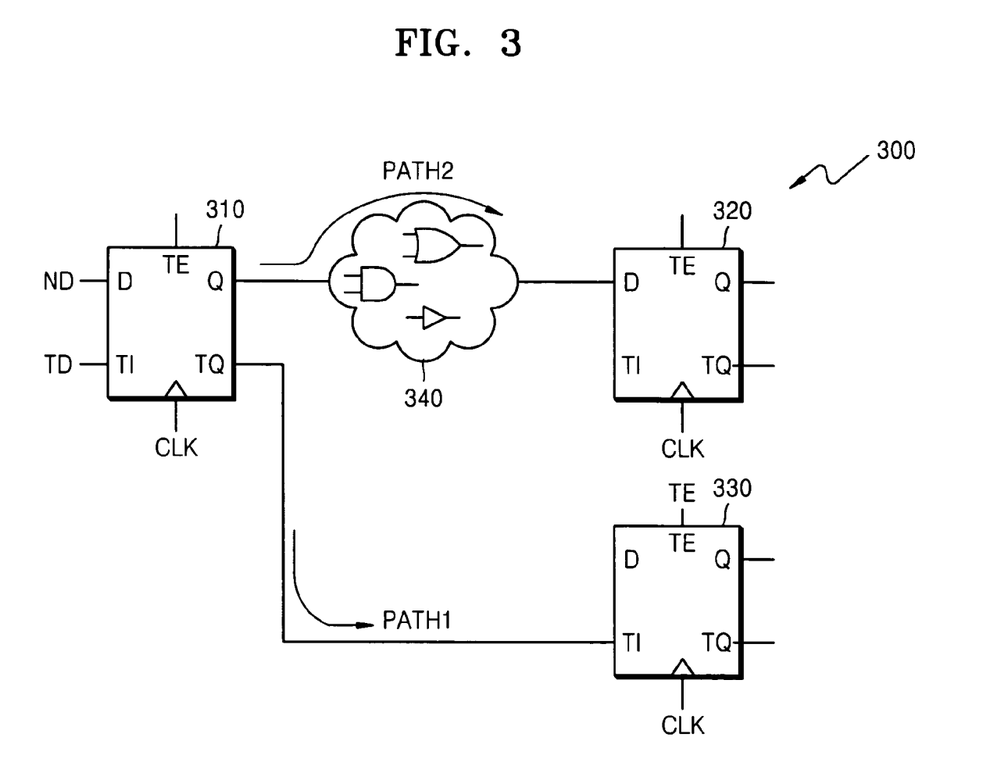
FIG. 3 is a circuit diagram showing a part of a system using a path data transmission unit according to an exemplary embodiment of the present invention.

FIG. 3 is a circuit diagram showing a part of a system using a path data transmission unit according to an exemplary embodiment of the present invention.

Referring to FIG. 3, the system 300 includes a first path data transmission unit 310, a second path data transmission unit 320, a third path data transmission unit 330, and a function block 340. Internal circuits of the three path data transmission units 310, 320, and 330 will be described in detail with reference to FIG. 4.

The first path data transmission unit 310 transmits normal data ND to the second path Path2, which is a normal path, via a first input terminal D and a first output terminal Q, when the test enable signal TE indicates a normal mode. The first path data transmission unit 310 transmits test data TD to the first path Path1 via a second input terminal TI and a second output terminal TQ, when the test enable signal TE indicates the test mode.

In the middle of the second path Path2, there is a function block 340, which includes a plurality of logic gates and flip-flops used to perform predetermined operations. In other words, the normal data ND transmitted from the first output terminal Q of the first path data transmission unit 310 is processed by the function block 340 and transmitted to the second path data transmission unit 320. The output of the function block 340 is directly transmitted to other predetermined function blocks (not shown) and used to perform additional operations of the overall device. In addition, the output of the second path data transmission unit 320 that receives the output data of the function block 340 may be transmitted to other internal function blocks to be used for subsequent operations.

The second path data transmission unit 320, however, is used as a tool for checking whether the function block 340 operates normally in the test mode. In other words, the test data is transmitted to the function block 340 and, in response to the test data, the output signal is transmitted to the second path data transmission unit 320. Therefore, if the output of the second path data transmission unit 320 is checked from the outside of the system, it can be determined whether the function block 340 operates normally or not.

In FIG. 3, only one function block 340 is illustrated, but in a real system, although not shown, a plurality of the function blocks exist, and normal data or test data is transmitted to the function blocks from the path data transmission unit (not shown).

In order to verify the electrical characteristics of the function blocks, every function block may be tested, but in general, the electrical characteristics of only a few selected function blocks need be tested. Accordingly, not only the normal data but also the test data need not be transmitted to the unselected function blocks. In a case when a function block (not shown) other than the function block 340 is to be tested, while the first path data transmission unit 310 and the third path data transmission unit 330, which are connected in series, transmit the test data normally, no data should be transmitted to the function block 340. Thus, the data that is transmitted from the first output terminal Q of the first path data transmission unit 310 is designed to have a predetermined DC value. The predetermined DC value will be described in detail below with reference to FIG. 4.

Accordingly, if a system is configured to have the path data transmission units 310, 320, and 330 according to an exemplary embodiment of the present invention, the predetermined DC voltage is applied to the unselected function blocks while the test data is transmitted to the selected function block, so that the unselected function blocks cannot operate.

Figure 4:
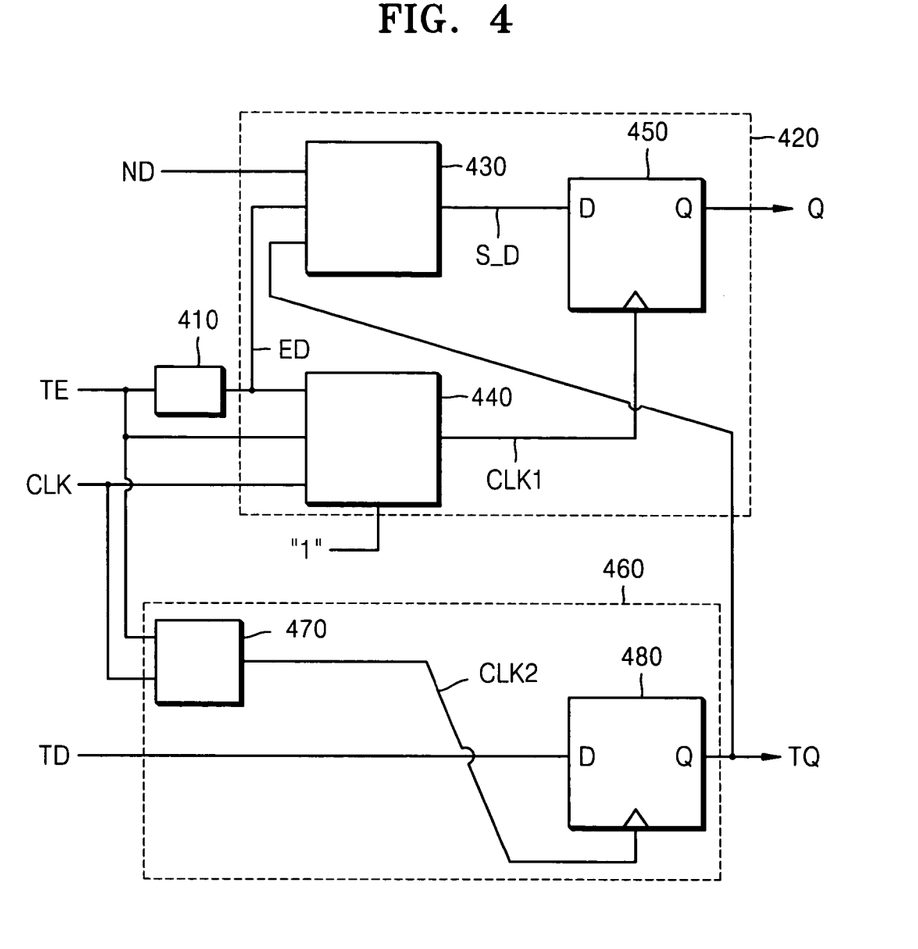
FIG. 4 is a block diagram showing a path data transmission unit according to an exemplary embodiment of the present invention.

FIG. 4 is a block diagram showing a path data transmission unit according to an exemplary embodiment of the present invention.

Referring to FIG. 4, the path data transmission unit includes an edge detector 410, a first path data transmission block 420, and a second path data transmission block 460.

The edge detector 410 detects an edge when the test enable signal TE changes from a voltage level indicating the test mode to a voltage level indicating the normal mode and transmits an edge detection signal ED. The edge detection signal is used to prevent the transmission of an unwanted error signal to function blocks when the test enable signal TE is transiting from the test mode to the normal mode.

In the explanation below, the voltage of the test enable signal TE in the test mode is assumed to be higher than the voltage level of the test enable signal TE in the normal mode. The edge detector 410 and the operations thereof will be described in detail with reference to FIGS. 5 and 9.

Figure 5:
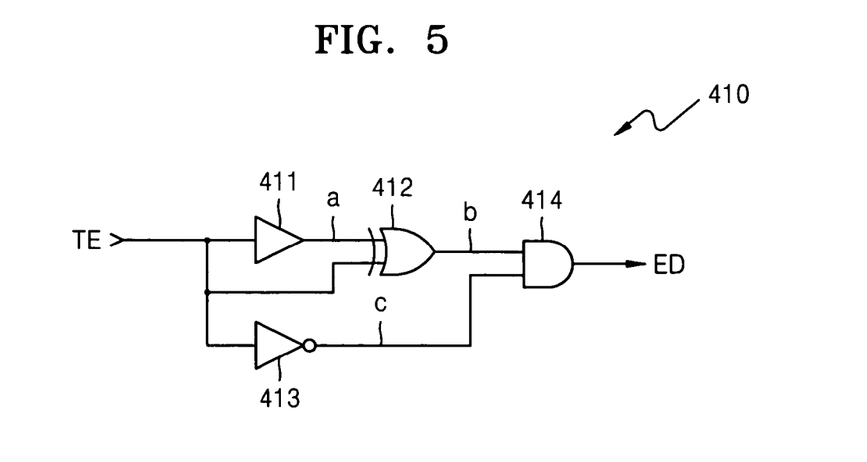
FIG. 5 is an internal circuit diagram showing an example of an edge detector used in the circuit shown in FIG. 4.

FIG. 5 is an internal circuit diagram showing an example of the edge detector 410 shown in FIG. 4.

Figure 9:
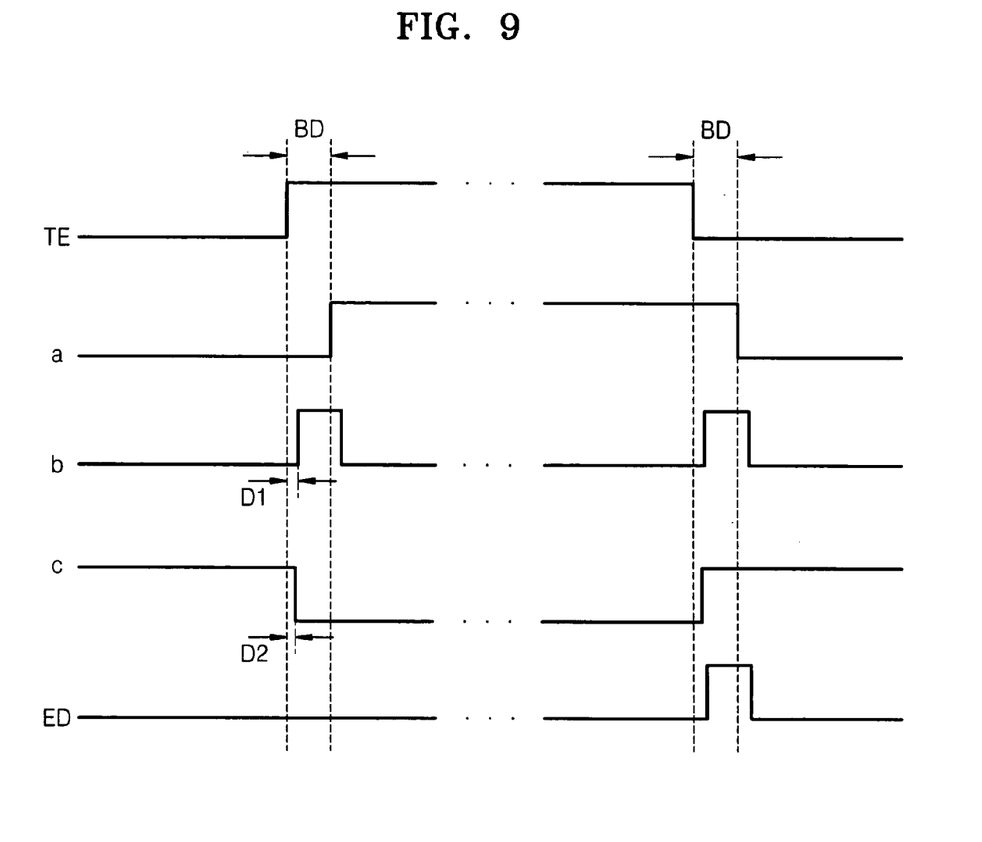
FIG. 9 is a wave form diagram showing an internal signal of the edge detector shown in FIG. 5.

FIG. 9 is a wave form diagram showing an internal signal of an edge detector shown in FIG. 5.

Referring to FIG. 5, the edge detector 410 includes a buffer 411, an exclusive OR gate 412, an inverter 413, and an AND gate 414.

The buffer 411 transmits a test enable signal TE delayed for a predetermined time BD. Referring to FIG. 9, the delay times BD of the rising and falling edges in signal a are assumed to be the same for the convenience of description.

The exclusive OR gate 412 transmits signal b that is determined based on the logic status of the test enable signal TE and the signal a. The signal b changes to a logic high state after a predetermined delay time D1 from the rising edge of the test enable signal TE. Similarly, the signal b changes to a logic low state after a predetermined delay time from the falling edge of the test enable signal TE. Although the delay time of the falling edge is not illustrated, the delay times of the rising and falling edges are assumed to be equal to each other. The signal b goes high not only at the rising edge but also at the falling edge of the test enable signal TE.

The inverter 413 transmits a signal c that is a phase inverted signal of the test enable signal TE. The signal c changes to a logic low state after a predetermined delay time D2 from the rising edge of the test enable signal TE. The signal c changes to a logic high state after a predetermined delay time from the falling edge of the test enable signal TE. Here, the delay times of the rising and falling edges are assumed to be equal to each other, and the delay time of the falling edge is not illustrated.

In general, the delay time D2 of the inverter 413 is shorter than the delay time D1 of the exclusive OR gate 412. In other words, the delay time D1 is longer than the delay time D2.

The AND gate 414 transmits an edge detection signal ED that is a logic multiplication of signals b and signal c. There is no response of the edge detection signal ED for the signal b occurring at the rising edge of the test enable signal TE and the corresponding signal c. As described above, the delay time D1 is longer than the delay time D2, so that the logic multiplication results in a logic low state for the AND gate 414. On the other hand, there is a response of the edge detection signal ED in the form of a pulse for the signal b occurring at the falling edge of the test enable signal TE and the corresponding signal c.

The first path data transmission block 420 outputs a first path data Q in response to the test enable signal TE, the edge detection signal ED, the clock signal CLK, the normal data ND, and the second path data TQ. The first path data transmission block 420 includes a first selector 430, a second selector 440, and a first flip-flop 450.

Figure 6:
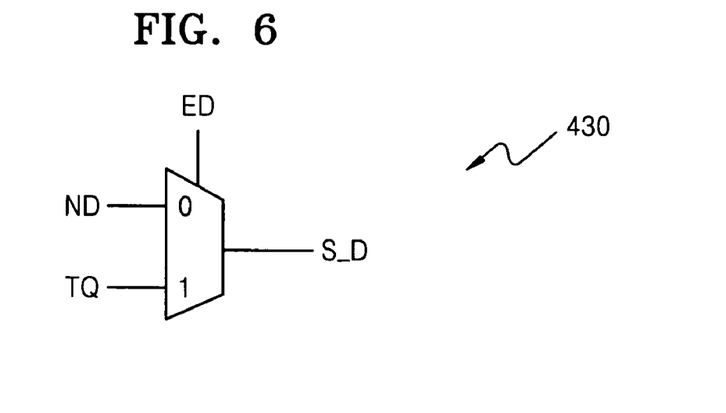
FIG. 6 is a circuit diagram showing an example of a first selector used in the circuit of FIG. 4.

FIG. 6 is a circuit diagram showing an example of the first selector 430 used in the circuit of FIG. 4.

Referring to FIG. 6, the first selector 430 selects one of the normal data ND and the second path data TQ and outputs the selected data as a first selection signal S_D in response to the edge detection signal ED. The first selector 430 may be implemented by a multiplexer. The first selector 430 selects the normal data ND when the edge detection signal ED is in a logic low state, that is, "0", and selects the second path data TQ when the edge detection signal ED is in a logic high state, that is, "1".

Figure 7:
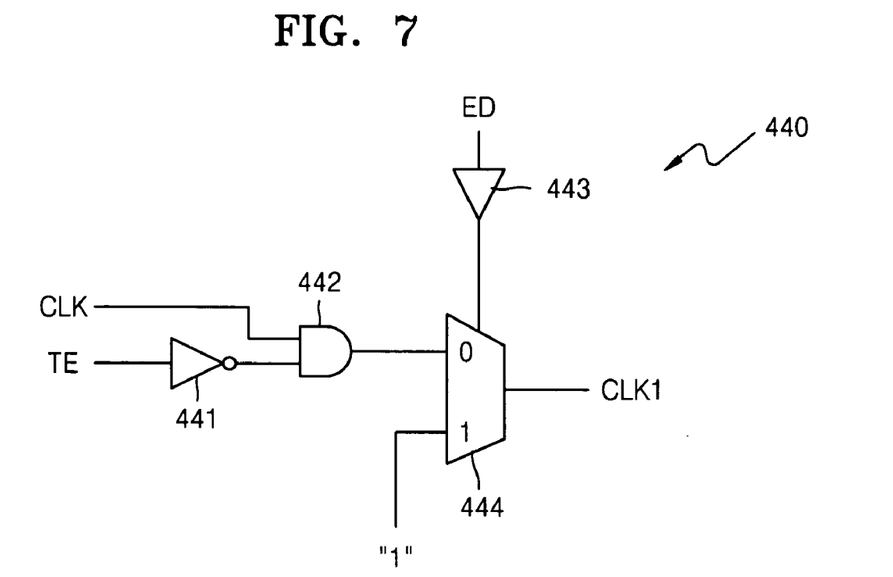
FIG. 7 is a circuit diagram showing an example of a second selector used in the circuit of FIG. 4.

FIG. 7 is a circuit diagram showing an example of the second selector 440 used in the circuit of FIG. 4.

Referring to FIG. 7, the second selector 440 transmits a first clock signal CLK1 using the clock signal CLK, the test enable signal TE and the predetermined DC voltage corresponding to a logic high state "1" in response to the edge detection signal ED. The second selector 440 includes an inverter 441, an AND gate 442, a buffer 443, and a multiplexer 444. The inverter 441 inverts the phase of the test enable signal TE. The AND gate 442 logic multiplies the clock signal CLK and the output signal of the inverter 441. The buffer 443 transmits a signal obtained by delaying the edge detection signal ED for a predetermined time. The multiplexer 444 selects either the output signal of the AND gate 442 or the predetermined DC voltage "1" and outputs the selected one in response to the edge detection signal ED delayed for a predetermined time by the buffer 443. Here, "1" means a DC voltage corresponding to a logic high state. The multiplexer 444 selects the output of the AND gate 442 when the edge detection signal ED is in a logic low state "0" and selects the predetermined DC voltage "1" when the edge detection signal is in a logic high state "1". The multiplexer 444 outputs the selected one as a first clock signal CLK1.

The first flip-flop 450 shown in FIG. 4 stores the first selection signal S_D and transmits the first path data Q in response to the first clock signal CLK1 and transmits the first path data Q.

A second path data transmission block 460 transmits the second path data TQ in response to the test enable signal TE, the clock signal CLK and the test data TD. The second path transmission block 460 includes a logic multiplier 470 and a second flip-flop 480.

Figure 8:
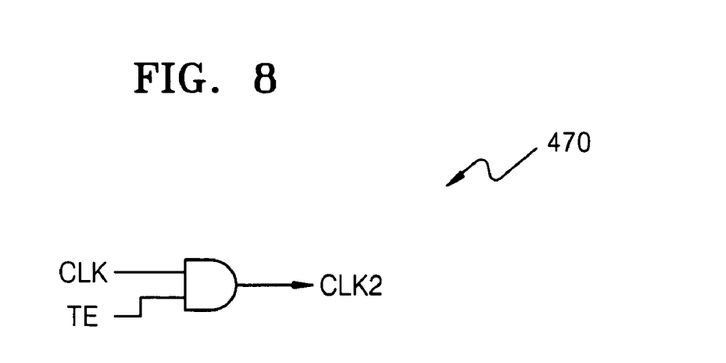
FIG. 8 is a circuit diagram showing an example of a logic multiplier used in the circuit of FIG. 4.

FIG. 8 is a circuit diagram showing an example of logic multiplier 470 used in the circuit of FIG. 4.

Referring to FIG. 8, the logic multiplier 470 transmits the second clock signal CLK2 which is a logic multiplication of the test enable signal TE and the clock signal CLK.

The second flip-flop 480 shown in FIG. 4 stores the test data TD and transmits the second path data TQ in response to the second clock signal CLK2.

The first flip-flop 450 and the second flip-flop 480 may be implemented by using any kind of flip-flop. Since the flip-flops are not directly related to the present invention, description of the flip-flips is omitted.

Now, the operations of the path data transmission unit according to exemplary embodiments of the present invention shown in FIGS. 4 to 8 will be described.

First, the moment when the test enable signal TE is transiting from a logic high state to a logic low state will be described.

Referring FIG. 9, the edge detection signal ED forms a pulse in response to the moment when the test enable signal TE transits from a logic high state to a logic low state. The moment when the test enable signal TE is transiting from a logic high state to a logic low state means a moment when the mode changes from the test mode to the normal mode. At this time, the pulse of the edge detection signal ED is used to prevent transmission of unexpected data to the function block 340 that operates in response to receiving the first path data Q.

If the edge detection signal ED changes to a logic high state, the second path data TQ is selected as the first selection signal S_D and the logic high state is selected as the first clock signal CLK1 which is transmitted from the multiplexer 444 of the second selector 440.

If the edge detection signal ED changes to a logic low state, the normal data ND is selected as the first selection signal S_D. Since the test enable signal TE that is transmitted to the inverter 441 of the second selector 440 is in a logic low state, the clock signal CLK is transmitted from the AND gate 442. Accordingly, the clock signal CLK that is transmitted from the AND gate 442 is selected as the first clock signal CLK1 that is transmitted from the multiplexer 444 of the second selector The first clock signal CLK1, which is used in the first flip-flop 450, is in a logic high state and operates in the same way as the clock signal CLK after a predetermined time in response to the edge detection signal ED that occurred as a pulse at the moment when the test enable signal TE changes from a logic high state to a logic low state. Accordingly, the first flip-flop 450 transmits the second path data TQ, which is received through the input terminal D when the first clock signal CLK1 is in a logic high state, as the first path data Q at the moment when the first clock signal CLK1 changes to a logic low state for the first time. Then, the first flip-flop 450 transmits the normal data ND in response to the continuing first clock signal CLK1.

Now, the steady state in which the test enable signal TE indicates the normal operation mode and the steady state in which the test enable signal TE indicates the test mode will be described. The steady state means a part of a signal that is not located on the edge of the signal.

When the test enable signal TE maintains a logic high state that is the steady state indicating the test mode, the edge detection signal ED is in a logic low state. Accordingly, the first selector 430 selects the normal data ND as the first selection signal S_D. When the test enable signal TE is in the logic high state, the output of the AND gate 442 is fixed to a logic low state. Since the first clock signal CLK1 that is transmitted from the multiplexer 444 of the second selector 440 is fixed to a logic low state, the first flip-flop 450 that operates in response to the first clock signal CLK1 does not operate. On the other hand, since the clock signal CLK is transmitted from the AND gate 470 of the second selector 460, the second path data TQ of the second flip-flop 480 that operates in response to the second clock signal CLK2 transmits the test data TD.

When the test enable signal TE maintains a logic low state that is the steady state indicating the normal operation mode, the edge detection signal ED is in a logic low state. Accordingly, the first selector 430 selects the normal data ND as the first selection signal S_D. When the test enable signal TE is a logic low state, the output of the AND gate 442 is the clock signal CLK. Since the first clock signal CLK1 which is transmitted from the multiplexer 444 of the second selector 440 is the clock signal CLK, the first flip-flop 450 that operates in response to the first clock signal CLK1 transmits the normal data ND as the first path data Q. On the other hand, since the output of the AND gate 470 of the second selector 460 is fixed to a logic low state, the second flip-flop 480 that operates in response to the second clock signal CLK2 does not operate.

To sum up, when the test enable signal TE indicates the test mode, the first path data transmission block 420 maintains a voltage level of the normal data ND while the test enable signal TE indicates the test mode. Also, the first path data transmission block 420 outputs a first voltage level at the moment when the test enable signal TE indicates a change from the test mode to a normal operation mode and outputs the first path data Q equal to the normal data ND while the normal operation mode continues.

When the test enable signal TE indicates the test mode, the second path data transmission block 460 outputs the second path data TQ equal to the test data TD and maintains a voltage level of test data TD outputted in the test mode. In this example, the first voltage level is the voltage level of the second path data TQ right before the test enable signal TE changes from the test mode to the normal mode.

As described above, a path data transmission unit according to exemplary embodiments of the present invention prevents unnecessary power consumption in a test mode and there is provided an advantage in that the path data transmission unit prevents the function block from malfunctioning even in a transient state during which the system changes from the test mode to the normal mode.

While the present invention has been particularly shown and described with reference to exemplary embodiments thereof, it will be understood by those skilled in the art that various changes in form and details may be made therein without departing from the spirit and scope of the present invention, as defined by the appended claims.

What is claimed is:

1. A path data transmission unit that operates in response to a test enable signal and a clock signal, comprising:
   a first input terminal that receives normal data;
   a second input terminal that receives test data;
   a first output terminal that maintains a voltage level of the normal data while the test enable signal indicates a test mode, outputs a first voltage level at a time when the test enable signal indicates a change from the test mode to a normal operation mode, and outputs the normal data while the normal operation mode continues; and
   a second output terminal that outputs the test data when the test enable signal indicates the test mode and maintains a voltage level of the test data outputted in the test mode
   wherein the first voltage level is a voltage level of the test data outputted through the second output terminal right before the test enable signal indicates the change from the test mode to the normal operation mode.

2. A path data transmission unit comprising:
   an edge detector that detects an edge of a test enable signal indicating one of a normal operation mode and a test mode and outputs the detected edge as an edge detection signal;
   a first path data transmission block that outputs a first path data in response to the test enable signal, the edge detection signal, a clock signal, normal data, and a second path data; and
   a second path data transmission block that outputs the second path data in response to the test enable signal, the clock signal, and test data,
   wherein the first path data transmission block maintains a voltage level of the normal data while the test enable signal indicates the test mode, outputs a first voltage level when the test enable signal indicates a change from the test mode to the normal operation mode and then outputs the first path data equal to the normal data while the normal operation mode continues, and wherein the second path data transmission block outputs the second path data equal to the test data when the test enable signal indicates the test mode and maintains a voltage level of the test data outputted in the test mode, and
   wherein the first voltage level is the voltage level of the second path data right before the test enable signal indicates the change from the test mode to the normal operation mode.

3. The path data transmission unit of claim 2, wherein the edge detected by the edge detector is an edge at an instant when the test enable signal changes from a voltage level indicating the test mode to a voltage level indicating the normal operation mode.

4. The path data transmission unit of claim 3, wherein the voltage level indicating the test mode is higher than the voltage level indicating the normal operation mode in the test enable signal.

5. The path data transmission unit according to claim 2, wherein the edge detector comprises:
   a buffer that transmits a delayed test enable signal for a predetermined time;
   an exclusive-OR gate that operates in response to the test enable signal and the output signal of the buffer;
   an inverter that inverts the test enable signal; and
   an AND gate that outputs the edge detection signal that is the logic multiplication of the output of the exclusive OR gate and the output signal of the inverter.

6. The path data transmission unit according to claim 2, wherein the first path data transmission block comprises:
   a first selector that selects between the normal data and the second path data, and outputs the selected data as a first selection signal in response to the edge detection signal;

a second selector that outputs a first clock signal using the clock signal, the test enable signal, and a predetermined DC voltage in response to the edge detection signal; and a flip-flop that stores the first selection signal and outputs the first path data in response to the first clock signal.

7. The path data transmission unit of claim 6, wherein the first selector is a first multiplexer.

8. The path data transmission unit of claim 7, wherein the first multiplexer selects the second path data when the edge detection signal is in a state of logic high and selects the normal data when the edge detection signal is in a state of logic low.

9. The path data transmission unit of claim 6, wherein the second selector comprises:

an inverter that inverts the test enable signal;

an AND gate that transmits the logic multiplication of the clock signal and the output signal of the inverter;

a buffer that outputs a delayed edge detection signal for a predetermined time; and a second multiplexer that selects and outputs one of the output signal of the AND gate and the predetermined DC signal in response to the output signal of the buffer.

10. The path data transmission unit of claim 9, wherein the predetermined DC voltage has a voltage level that corresponds to a logic high state.

11. The path data transmission unit of claim 9, wherein the second multiplexer selects the predetermined DC voltage when the edge detection signal is in a state of logic high and selects the output signal of the AND gate when the edge detection signal is in a state of logic low.

12. The path data transmission unit of claim 2, wherein the second path data transmission block comprises:

a logic multiplier that logically multiplies the test enable signal and the clock signal and outputs a result as a second clock signal; and a flip-flop that stores the test data and outputs the second path data in response to the second clock signal.

* * * * *